(12) United States Patent
Hoffman et al.

(10) Patent No.: US 9,482,699 B2
(45) Date of Patent: Nov. 1, 2016

(54) METHOD AND APPARATUS FOR MONITORING HIGH VOLTAGE BUSHINGS SAFELY

(71) Applicants: Gary R Hoffman, Randolph, NJ (US); Edward S. Kwon, Fort Lee, NJ (US); Mikhail Benis, Woodridge, NJ (US)

(72) Inventors: Gary R Hoffman, Randolph, NJ (US); Edward S. Kwon, Fort Lee, NJ (US); Mikhail Benis, Woodridge, NJ (US)

(73) Assignee: ADVANCED POWER TECHNOLOGIES, LLC, Randolph, NJ (US)

( * ) Notice: Subject to any disclaimer, the term of this patent is extended or adjusted under 35 U.S.C. 154(b) by 334 days.

(21) Appl. No.: 14/303,591

(22) Filed: Jun. 12, 2014

(65) Prior Publication Data

US 2014/0368215 A1 Dec. 18, 2014

Related U.S. Application Data

(60) Provisional application No. 61/956,835, filed on Jun. 18, 2013.

(51) Int. Cl.
| | |
|---|---|
| *G01R 31/12* | (2006.01) |
| *G01R 1/36* | (2006.01) |
| *G01R 19/00* | (2006.01) |
| *G01R 15/16* | (2006.01) |

(Continued)

(52) U.S. Cl.
CPC ............ *G01R 15/16* (2013.01); *G01R 1/36* (2013.01); *G01R 15/14* (2013.01); *G01R 19/0084* (2013.01); *G01R 31/1227* (2013.01); *G01R 15/22* (2013.01); *G01R 31/1245* (2013.01); *G01R 31/1272* (2013.01)

(58) Field of Classification Search
CPC .. G01R 31/002; G01R 31/021; G01R 31/12; G01R 31/1227; G01R 31/1245; G01R 31/1272; G01R 27/2617; G01R 19/00; G01R 19/0007; G01R 19/0084; G01R 19/0092; G01R 15/12; G01R 15/144; G01R 15/146; G01R 15/16; G01R 15/22; G01R 1/36; G01R 21/06; G01N 27/20; G01N 27/205; G01N 27/82; B60L 3/0069; H01M 5/0033

USPC ....... 324/500, 519, 537, 541, 544, 551, 552, 324/557, 76.11, 126, 133, 658; 702/1, 57, 702/64

See application file for complete search history.

(56) References Cited

U.S. PATENT DOCUMENTS

| | | | | |
|---|---|---|---|---|
| 4,757,263 A | * | 7/1988 | Cummings, III | ...... G01R 15/14 324/126 |
| 4,914,382 A | * | 4/1990 | Douville | ................ G01R 15/06 324/102 |

(Continued)

*Primary Examiner* — Hoai-An D Nguyen
(74) *Attorney, Agent, or Firm* — Henry I. Schanzer, Esq.

(57) ABSTRACT

The voltage at the test tap of a high voltage bushing is applied to a bushing coupler which includes circuitry to sense and process voltages generated at the test tap and convert the voltages into corresponding data signals. Data signals corresponding to the test tap voltages are then transmitted wirelessly to a bushing monitoring system. The wireless transmission may be, for example, via an optical coupling (e.g., fiber optics) arrangement or an electromagnetic radiation (e.g., RF transmission) arrangement. Thus, the signals from the bushing coupler are wirelessly transmitted to a monitoring system which is not conductively connected to the bushing coupler and the test tap. The bushing coupler includes a power supply which is chargeable from the test tap or wirelessly from the bushing monitoring system which is adapted to receive values of the high voltage applied to the bushing and to calculate changes in the values of selected bushing parameters.

20 Claims, 9 Drawing Sheets

(51) Int. Cl.
  *G01R 15/14*   (2006.01)
  *G01R 15/22*   (2006.01)

(56) References Cited

U.S. PATENT DOCUMENTS 5,903,158 A * 5/1999 Eriksson ............ G01R 31/1227
                                                    324/536
6,538,422 B2 * 3/2003 Potter .................... G01R 15/16
                                                    324/126
6,927,562 B2 * 8/2005 Anand ............... G01R 27/2688
                                                    324/126
7,126,348 B2 * 10/2006 Adolfsson ............. G01R 15/16
                                                    324/658
2015/0355237 A1 * 12/2015 Kutzner ............ G01R 31/1227
                                                    324/110

* cited by examiner

METHOD AND APPARATUS FOR MONITORING HIGH VOLTAGE BUSHINGS SAFELY

This application claims priority based on a provisional application titled METHOD AND APPARATUS FOR INTRINSICALLY SAFE MONITORING OF HIGH VOLTAGE BUSHINGS bearing Ser. No. 61/956,835 filed Jun. 18, 2013 whose teachings are incorporated herein by reference.

BACKGROUND OF THE INVENTION

This invention relates to methods and apparatus for monitoring the condition and status of high voltage bushings used in conjunction with power transformers and, in particular, to methods and apparatus for doing so safely.

Figure 1:
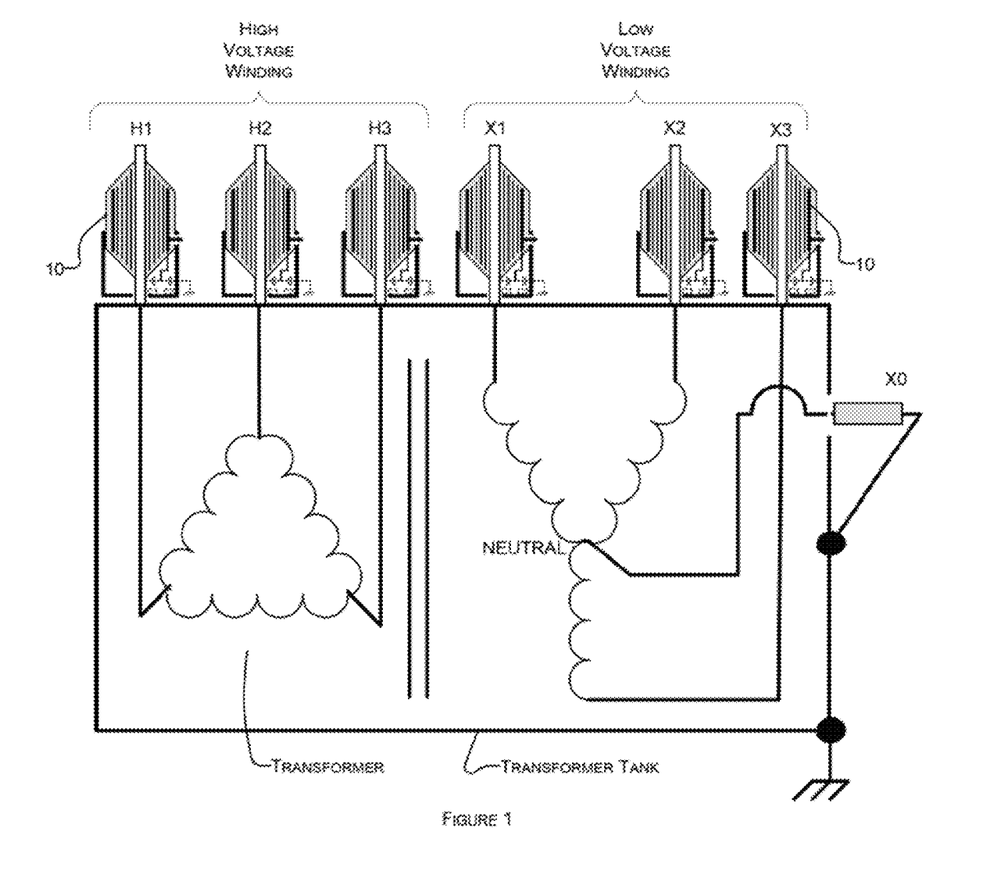
FIG. 1 is a schematic drawing of a prior art transformer illustrating the windings of a typical Delta-Wye connected power transformer and associated bushings.

Power transformers are one of the principal elements of the power system and bushings are an important component of transformer equipment. As shown in FIG. 1, high voltage bushings 10 are coupled and located about the high power transformer terminals. The bushings generally include specially designed electrical terminals for taking out winding ends (leads) through openings provided in the cover or wall of transformer tanks and connecting to incoming and outgoing lines. The bushings act as insulators to prevent a short circuit or "arcing". In large power transformers, the voltages used are so high that the wires cannot be allowed to come too close to each other, or too close to the metal casing of the transformer. If they do get too close, then the voltage can actually jump through the air (electrical breakdown), and create a short circuit. Bushings are therefore an important element in the reliable operation of their associated transformers. On a global scale, defects of bushings reportedly cause from 10% to 40% of the total number of failures of power transformers.

Figure 1A:
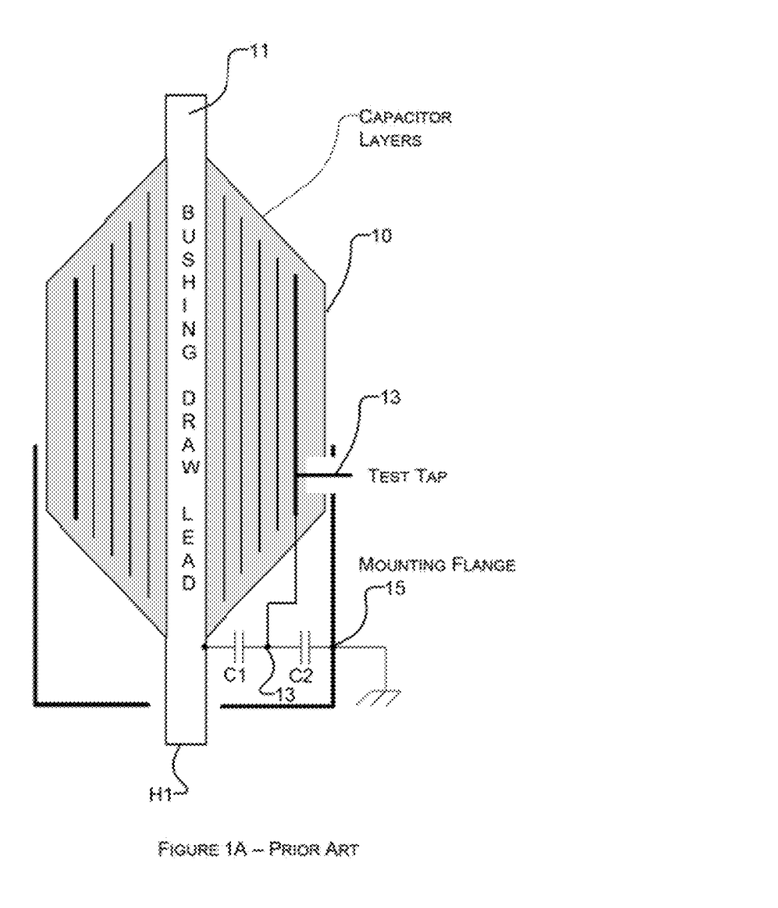
FIG. 1A illustrates the symbolic electrical equivalent of a typical high voltage bushing and is a partial cross section and partial schematic drawing of a prior art high voltage bushing which may be used to practice the invention.

Bushings used in electrical distribution and transmission systems enable high voltages (e.g., from less than 69 kVAC to more than 765 kVAC) to be connected to devices such as transformers and circuit breakers. High voltage bushings of interest include capacitive layers to provide voltage grading across the bushing. The capacitance may range from less than 200 to more than 2,000 Pico farads. As shown in FIG. 1A, the capacitance of a bushing 10 may be represented as being split into two separate capacitors: C1 and C2; with C1 representing the capacitance between the test tap 13 and the high voltage point, or power terminal, 11 and C2 representing the capacitance between the test tap 13 and terminal 15 which is grounded. One side of C1 is the draw rod (lead) 11 which is the conductive lead to which the high voltage (HV) is applied and which passes through the bushing and the other side of capacitor C1 is connected to test tap 13. One side of the second capacitor C2 is connected to the test tap 13 and the other side of C2 is connected to ground 15. These capacitors may be constructed by using a conductive film on an insulating substrate (layer) that in many cases is paper. This insulating layer may be liquid-immersed typically in mineral oil; but, other insulating mediums could be used.

Over time the bushing and its associated capacitor layers may begin to degrade due to a faulty seal which allows ambient air or other contaminants to mix in with the insulating fluid. Also, moisture can accelerate the degradation of the bushing and its capacitive layers. As the capacitive layer begins to fail, there will be tracking on the paper layer due to evolving partial discharge.

Eventually, the C1 capacitor can short from the draw rod 11 to the bushing test tap 13. Should this occur, the line voltage which may range from 69 kV to 765 kV will be seen at the bushing test tap 13. While many existing bushing monitor couplers contain built in surge arrestors, should the surge arrestors fail or become inoperative, the full bushing potential will appear at the measurement hardware. Under this scenario the measurement electronics will be badly damaged possibly causing a localized fire. Even worse, there is the possibility of a serious or even a fatal injury should personnel be near the affected equipment.

Figure 2:
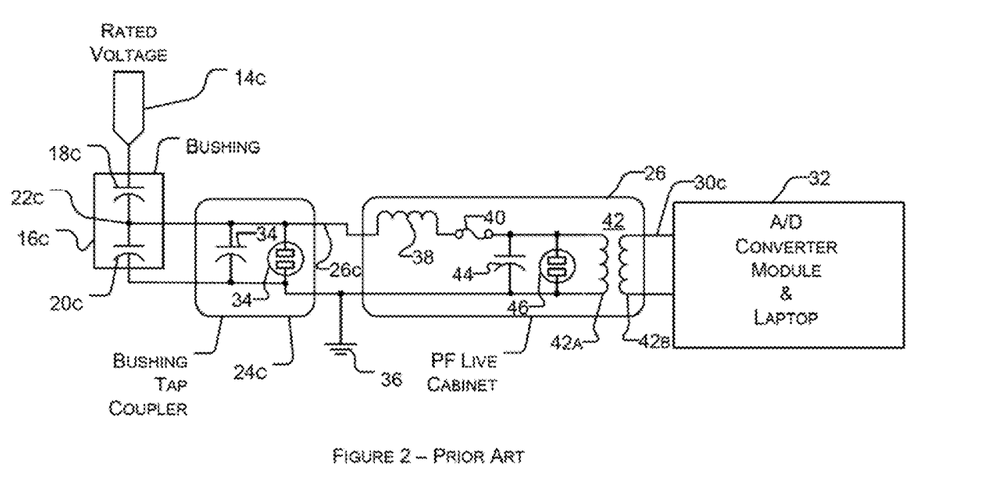
FIG. 2 is a drawing of a prior art high voltage bushing testing and monitoring circuit.
Figure 2A:
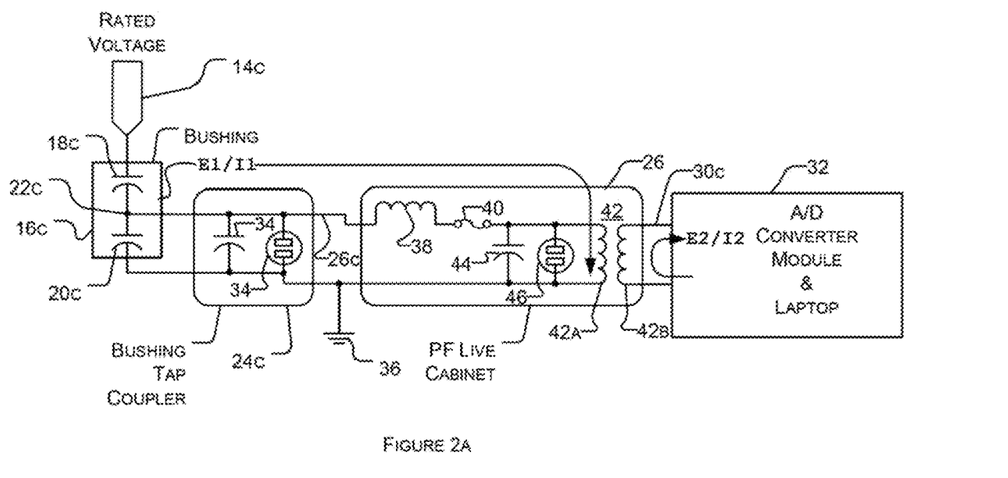
FIG. 2A illustrates a problem with the prior art system of FIG. 2.

A proposed solution to the problem using an isolation transformer to inductively couple the output of the bushing coupler to a monitoring system does not solve the problem. This may be illustrated by reference to a testing scheme disclosed in U.S. Pat. No. 6,927,562 titled Power Factor/Tan(δ) Testing Of High Voltage Bushings on Power Transformers, Current Transformers and Circuit Breakers. FIG. 2 of the U.S. Pat. No. 6,927,562 is redrawn as FIG. 2 (Prior Art) of the instant application. In the event of the failure of capacitor 18c, the full line voltage will appear at a center tap 22c. If the surge arrestors in the bushing coupler are inoperative, the full line voltage (E1/I1) will appear across the primary of transformer 42 as shown in FIG. 2A which is derived from FIG. 2. Transformer 42 would then have to sustain the entire voltage seen at the test tap. This could destroy the transformer 42 and, even if it does not destroy the transformer 42, an inordinately large and potentially dangerous voltage would be produced at the output side of transformer 42 destroying any testing or monitoring equipment (in box 32) coupled thereto and endangering the life of individuals operating the equipment.

It is an object of the invention to couple the test tap of a bushing to a bushing coupler whose output is transmitted to testing and monitoring equipment such that the testing and monitoring equipment and any operator of the equipment has no physical contact to the bushing coupler and/or the test tap of the bushing.

SUMMARY OF THE INVENTION

In accordance with the invention, the voltage at the test tap of a bushing is applied to a bushing coupler which includes electronic circuitry to sense and process the voltages generated at the test tap and convert the voltages into corresponding data signals. The data signals corresponding to the test tap voltages (but not any part of the voltages as in the prior art shown in FIG. 2) are then transmitted wirelessly to a bushing monitoring system. The wireless transmission may be, for example, via an optical coupling (e.g., fiber optics) arrangement or via an electromagnetic radiation (e.g., RF transmission) arrangement. Thus, in accordance with the invention, the output of the bushing coupler is wirelessly transmitted to a receiver which is non-conductively connected to and physically isolated from the bushing coupler and the test tap.

Data signals corresponding to, and representative of, the test tap voltage, rather than any portion of the actual test tap voltages, are wirelessly transmitted (i.e., without using an electrically conductive path which could couple potentially lethal voltages) to a bushing monitoring system (i.e., any suitable receiver) and its operator. Consequently, the high voltage signal source (test tap and/or bushing coupler) has no direct (or transformer) contact with the receiver. The bushing test tap voltages can be constantly and accurately sensed while avoiding the possibility of any portion of the actual tap voltage being applied to the testing or monitoring equipment. This makes for an intrinsically safe sensing and monitoring system.

Furthermore, in accordance with another aspect of the invention, in order to maintain the bushing coupler physically and conductively isolated from the monitoring equipment, the power supply for the electronic circuitry in the bushing coupler is operated from the test tap and/or charged via a wireless connection from the bushing monitoring system.

A still other aspect of the invention includes a novel method for the accurate calculation of the bushing capacitance. A signal corresponding to, and indicative of, the value of the line voltage (i.e., the line voltage applied to the draw lead of the bushing) is obtained from the electric utility company supplying the line voltage. The significance of getting this utility supplied voltage is that it is highly accurate (e.g., +/−100 VRMS). Every utility is constantly measuring the bus voltage. The utility energy management system (EMS) receives this information and can transmit the voltage with the required accuracy (e.g., via a DNP3, MODBUS, IEC 61850, or some other protocol). In accordance with the invention this information and the bushing test tap information are used to calculate the bushing capacitance (i.e., C1 and/or C2).

BRIEF DESCRIPTION OF THE DRAWINGS

In the accompanying drawings which are not drawn to scale like reference characters denote like components.

DETAILED DESCRIPTION OF THE DRAWINGS

As noted above, FIG. 1 is a schematic diagram of a three phase delta to wye power transformer (with the neutral grounded), encased in a transformer tank, used in a typical power transmission system for a step down application. The voltages applied to the primary of this transformer (via H1, H2, H3), via bushings 10, can vary over a wide range (e.g., from less than 69 kV to more than 765 kV) while voltages on the secondary (at X1, X2, X3) can also vary over a wide range (e.g., from less than 13.2 kV to more than 345 kV). As noted above with respect to FIGS. 1 and 1A, to prevent the possibility of flashover to the transformer tank or adjacent substation structures, the connections of each input and output line to the transmission or distribution system is made through an insulated bushing 10.

Figure 3:
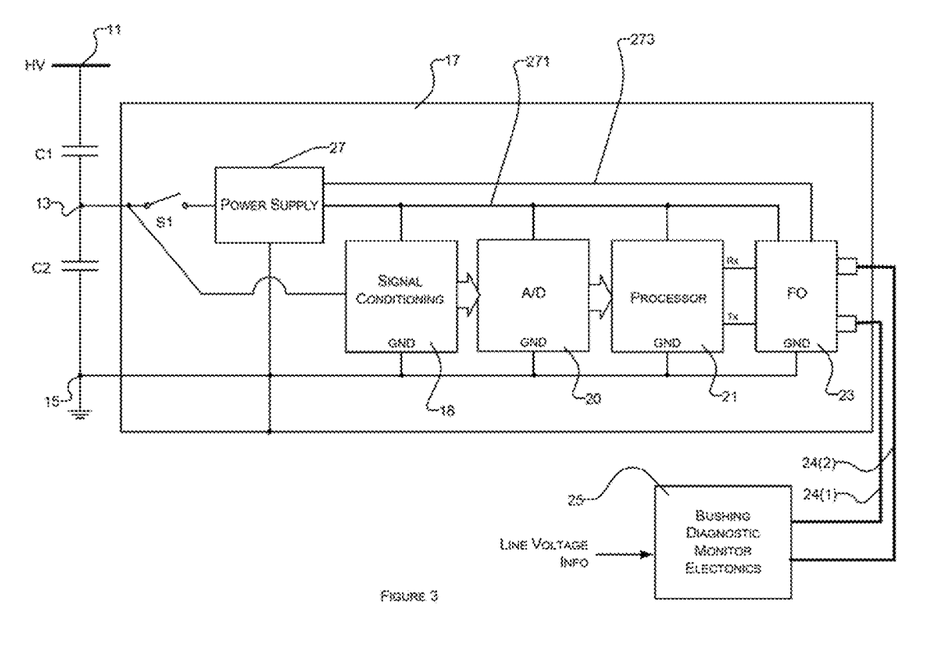
FIG. 3 is a simplified block diagram of a high voltage bushing coupler circuit whose input is coupled to a bushing test tap and whose output is optically coupled to bushing monitoring circuitry in accordance with the invention.

As shown schematically in FIG. 1A, each bushing includes a test tap 13 (meeting standards as set in IEEE Std. C57.19.01-2001) with two capacitors (C1, C2), corresponding to the capacitive layers, being connected to the test tap. As shown in FIG. 3, capacitor C1 has one side connected to the high voltage draw lead 11 and its other side connected to test tap 13 and capacitor C2 is connected between test tap 13 and ground terminal 15. The bushing test tap 13 may be selectively grounded (e.g., via a metal cover plate that bonds the bushing test tap to ground) to reduce the stressing of capacitor C2.

Capacitors C1 and C2 may be formed in any suitable manner. By way of example, capacitors C1 and C2 may be constructed of a metalized or electrically conductive ink layer to form one side of a capacitor on an insulating substrate. The insulating substrate for C1 and C2 is typically manufactured from cellulose but could be made of other high dielectric strength insulating materials. The insulating substrate may be immersed in an insulating liquid to improve the dielectric strength.

In order to determine the condition/status of a bushing it is desirable (if not necessary) to monitor the test tap voltage. As discussed above, known bushing monitoring schemes include circuitry for connecting to the bushing tap 13 via metallic conductors or isolation transformers (see prior art FIG. 2) to the measurement and monitoring circuitry. A drawback of the known methods is that if the capacitor layer (e.g., corresponding to C1) degrades significantly (e.g., shorts) an inordinately high voltage is applied to the monitoring electronics which would be destructive to the equipment and potentially lethal to any operator of the equipment. In all cases, this poses a great hazard to those that might be nearby or in contact with the equipment when this failure occurs. As already noted, safety or protective measures such as a surge arrester may be included to try to minimize the over voltage hazards. However, these protective and safety devices have been known to fail rendering the protection useless and the danger very real.

Another drawback of the known art is that in order to determine (calculate) the value of C1, the line voltage applied to the draw rod 11 has to be known very accurately. There is no simple or easy way to measure the line voltage that accurately.

Applicants' invention solves the problems discussed above. In accordance with the invention, the voltage at the test tap of a bushing is coupled to a bushing coupler which includes electronic circuitry necessary to sense and process the signal voltages generated at the test tap in order to assess the condition of the bushing. The voltage signals sensed and processed in a bushing coupler embodying the invention are converted to corresponding data signals which are wirelessly transmitted to a bushing monitoring system (e.g., a receiver also identified as a bushing diagnostic monitor electronics 25 in FIG. 3 or 251 in FIG. 4).

Figure 3A:
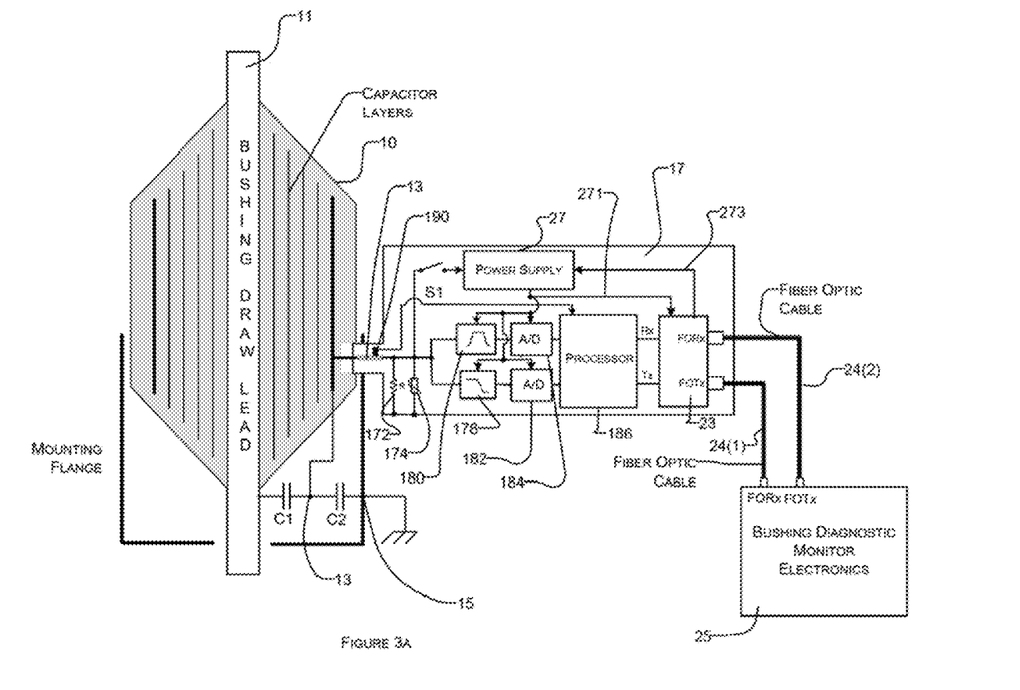
FIG. 3A is a more detailed block diagram of a high voltage bushing coupler whose input is coupled to a bushing test tap and whose output is optically coupled to monitoring circuitry in accordance with the invention.
Figure 3B:
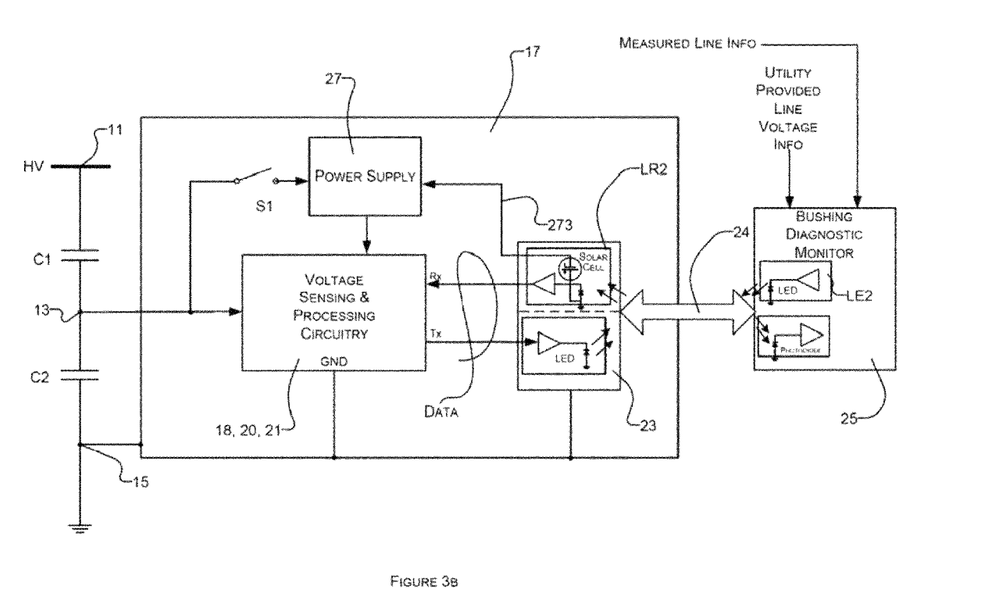
FIG. 3B is another block diagram of a high voltage bushing coupler whose input is coupled to a bushing test tap and whose output is optically coupled to monitoring circuitry in accordance with the invention.
Figure 4:
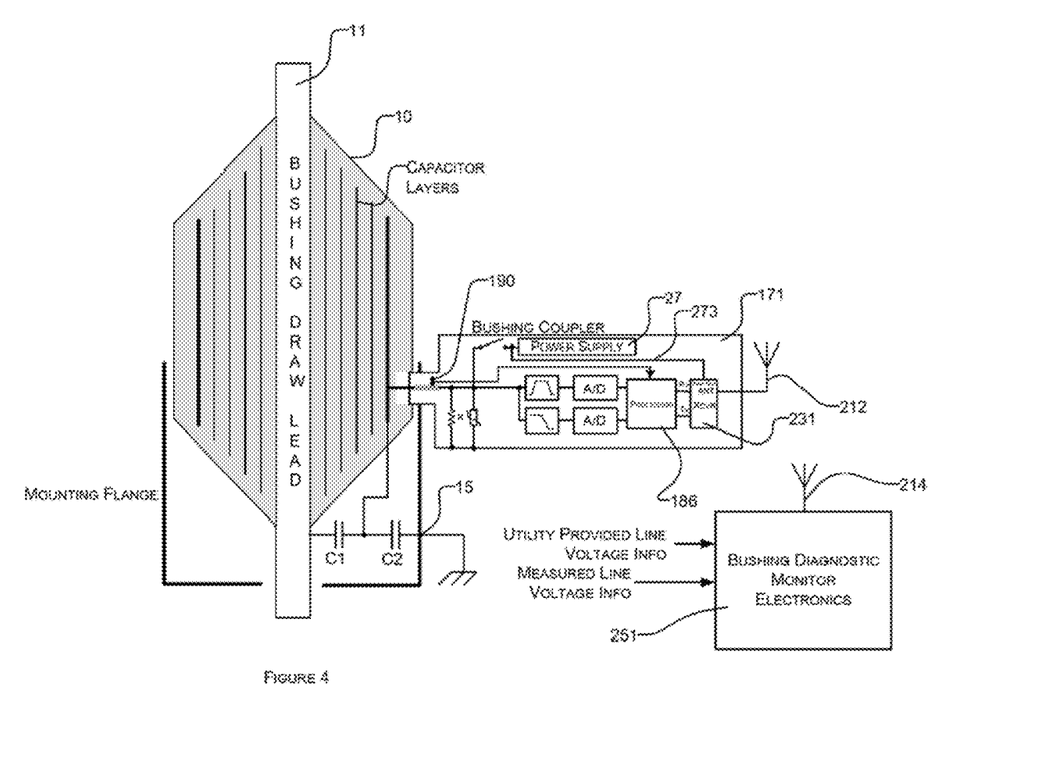
FIG. 4 is a block diagram of a high voltage bushing coupler whose input is coupled to a bushing test tap and whose output is coupled to testing and monitoring circuitry via electromagnetic radiation (RF) circuitry in accordance with the invention.
Figure 5:
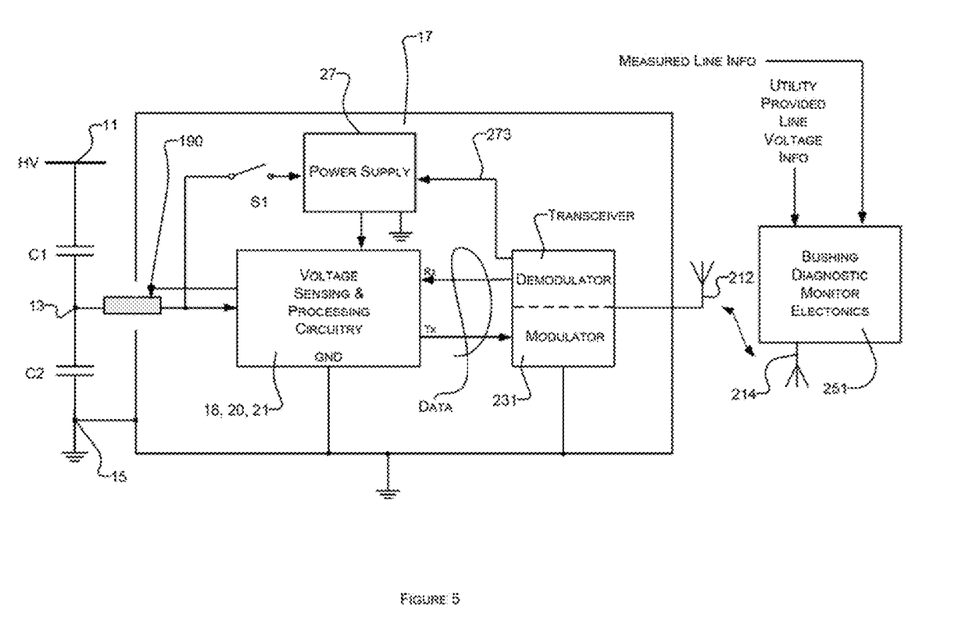
FIG. 5 is a simplified block diagram of a high voltage bushing coupler whose input is coupled to a bushing test tap and whose output is coupled to testing and monitoring circuitry via RF circuitry in accordance with the invention.

Examples of wireless transmission embodying the invention include an optical coupling arrangement as shown in FIGS. 3, 3A and 3B. Other examples of wireless transmission arrangement (as shown in FIGS. 4 and 5) whereby the receiver is physically isolated from the bushing coupler and the test tap. Consequently, the high voltage signal source (test tap and/or bushing coupler) has no conductive (or transformer) contact with the receiver.

FIG. 3 shows that the voltage at tap 13 is applied to a signal conditioning circuit 18 which includes circuitry for sensing the tap voltage and for protecting against overvoltage conditions and for producing a conditioned signal at an output. The conditioned output signal of the signal conditioning circuit 18 is applied to an analog to digital (A/D) converter circuit 20 which functions to convert the conditioned output voltage from the conditioning circuit 18 to data signals (e.g., which vary between zero to 5 volts in amplitude) which correspond to, and are representative of, the voltage values. Thus, as a first step in the design of a safe circuit, the actual voltages present at the bushing test tap 13 are not propagated beyond the A/D converter 20. Rather, digital signals of fixed amplitude (e.g., zero to 5 volts) are propagated from the output of A/D converter 20 to a microprocessor (also referred to as processor) 21. The fixed amplitude of the signals is determined by the voltage output of the power supply. Processor 21 functions to analyze the digital signals and to format the digital signals from the A/D converter 20 and to produce corresponding data signals at a transmitting output (Tx) which are applied to an input of a fiber optic (FO) module 23. FO module 23 functions to convert the formatted digital data signals into optical (light) signals which are wirelessly transmitted to fiber optics (FO) cable [24(1), 24(2)]. The FO cable [24(1), 24(2)] is connected to a bushing monitoring system 25 also identified as bushing diagnostic monitor electronics device 25. Device 25 includes circuitry for reconverting the received optic signals to digital signals. Thus, signals corresponding to the test tap voltage are wirelessly transmitted to and received by device 25. Device 25 includes electronic circuitry for analyzing (a) the signals corresponding to the test tap voltage and (b) information corresponding to the line voltage (i.e., the high voltage applied to terminal 11). Device 25 may also include alarms outputs and DNP 3.0, MODBUS, or IEC 61850 communications protocol interface indicating the condition of the bushing and its capacitors. Device 25 may thus be used to track the state of the bushing including selected parameters and to provide appropriate alarms and displays of its condition.

FIG. 3 also shows that bushing coupler 17 includes a power supply 27 coupled via a switch S1 to the voltage tap 13. The power supply 27 is designed to produce a direct current (DC) voltage which is distributed to the various circuits (e.g., 18, 20, 21, 23) of the bushing coupler via lines 271. As discussed below, to have the power supply 27 functional at all times and isolated form the monitoring electronics 25, the power supply 27 may also be charged or recharged wirelessly by signals (Rx) produced in FO module 23 in response to optic signals generated in device 25 and transmitted to FO module 23 via cables 24(1), 24(2).

In the embodiment shown in FIG. 3A the signal conditioning circuitry 18 of the bushing coupler 17 is shown to include a shunt resistor 172, a varistor 174, a low pass filter 178 and a high pass filter 180. The outputs of the filters are applied to analog to digital (A/D) converters 182 and 184 (which correspond to A/D converter 20 of FIG. 3). The outputs of the A/D converters are applied to a microprocessor 186 (which corresponds to processor 21 of FIG. 3) and whose output is fed to fiber optic (FO) converter 23. In FIG. 3A, a temperature probe 190, shown connected to tap 13, is used to sense the temperature of the bushing. The probe 190 supplies temperature signals to the processor 186 since the temperature is a significant factor in determining the value of the bushing capacitors.

The operation of the bushing coupler 17 is generally as follows. The voltage present at the tap 13 is applied to filters 178 and 180 whose outputs are respectively fed to A/D converters 182 and 184. The filter 178 coupled to A/D 182 may be used for measurement of partial discharge signals at the bushing tap and filter 180 and A/D converter 184 may be used to measure C1 capacitance. The A/D converters function to convert the amplitude of the test tap voltages into corresponding digital signals which are then fed to signal processor 186. The signal processor 186 is programmed to analyze the data signals and to format the signals to render the data signals suitable for transmission. The formatted transmitted output signals (Tx) of the processor 186 are then fed to an electric signal to fiber optic (FO) converter 23, which converts the electric signals to optical signals which are wirelessly transmitted onto fiber optic cables 24(1), 24(2).

FIG. 3B is intended to illustrate that the voltage, sensing and processing circuitry (18, 20, 21) produces data signals (Tx) which are supplied to and modulate one (or more) light emitting diode(s) (LED), located within an FO module 23. The light signals from the LED are wirelessly transmitted to fiber optic cables 24. The optical signals are transmitted along cable 24 to photoreceptors (e.g., photodiode) located in bushing diagnostic monitor 25 connected to diagnostic electronics (not shown). Note that there is no conductive connection between the light emitters LED and the fiber optic cable 24 and between the cable 24 and the photodiode. Accordingly, the light receptors are electrically and physically isolated from the test tap voltage.

In accordance with the invention, the characteristics and representations of the AC voltage signals at the test tap 13 are converted into corresponding digital signals within the bushing coupler so that the actual voltages present at the tap 13 are not propagated. Then, the data signals corresponding to the voltages are wirelessly transmitted via a module 23 to the bushing monitoring system 25 without the use of any metallic conductive path. In module 23 the electrical signals are dielectrically isolated from the output optic signals. The light output signals from module 23 are then coupled via optic fiber cables to a monitoring electronic system 25. Thus, even if capacitor C1 degrades completely (i.e., shorts), the voltages and/or currents produced at test tap 13 are not conductively (or physically) coupled to any circuitry beyond the electric to optic interface of FO converter 23. Should a drastic change (e.g., a short circuit) occur in the capacitor layer, the dielectric isolation of the optic fiber will prevent lethal voltages from being propagated and appearing at the monitoring electronic system 25. Thus, it is apparent that the bushing tap voltage has been sensed safely and that possible injury to equipment and operators of the equipment has been virtually eliminated. Note that locating the measurement electronics at the bushing tap makes the measurement of the AC waveform much more accurate and sensitive because the filtering needed is less severe. In addition, should a drastic change in the capacitor layer occur, the dielectric isolation of the optic fiber will prevent lethal voltages from appearing at the monitoring electronic system 23.

The fiber optic module(s) 23 converts digitally encoded electrical input signals into one or more FO (fiber optical) output signals. Fiber optics is a technology that uses glass (or plastic) threads (fibers) to transmit data. A fiber optic cable consists of a bundle of glass threads, each of which is capable of transmitting messages modulated onto light waves. The fiber optic cables can be run to the bushing monitor 25 to enable the coupling of signals indicative of the voltages at tap 13 without coupling any portion of the physical voltage itself.

Figure 6:
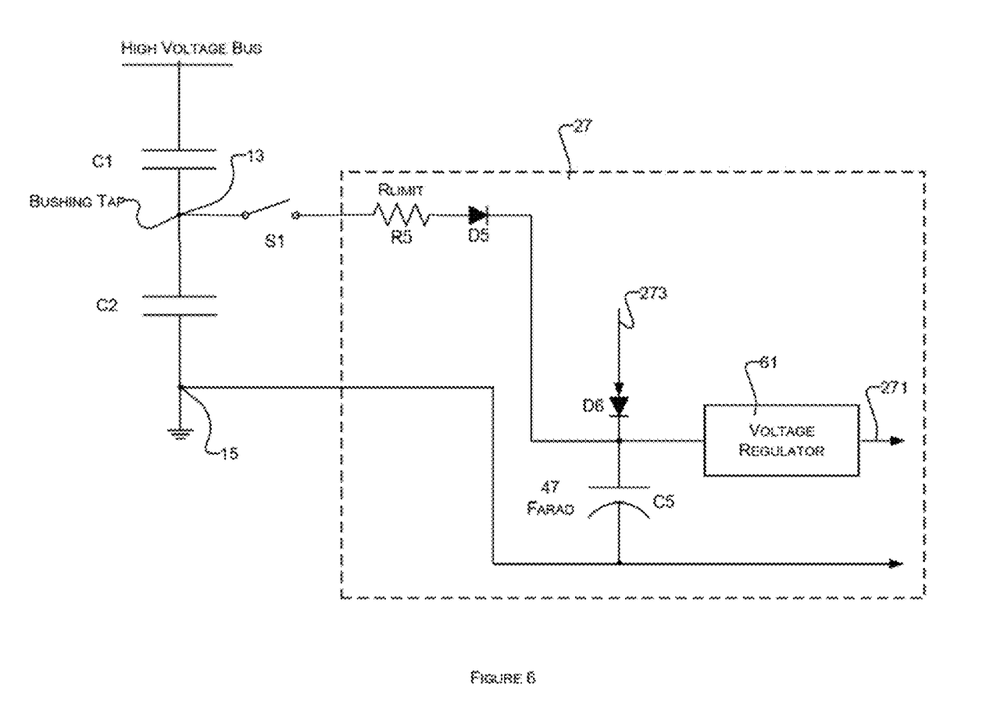
FIG. 6 is a semi schematic semi block diagram of a rectifying power supply for use in practicing the invention.

Another aspect of the invention pertains to the form and operation of the power supply 27. The bushing coupler 17 includes a power supply 27 which is coupled via switch S1 to tap 13. When the switch S1 is closed, the voltage at tap 13 may be fed to a rectifier circuit which, for example, as shown in FIG. 6 includes a limiting resistor, R5, a rectifying diode D5 and a relatively large capacitor C5 (shown for example to have a value of 47 Farads). The output of the rectifier circuit is fed to a voltage regulator 61 whose output is applied to line 271 to power the bushing circuitry with a regulated direct current (DC) voltage. Thus power supply 27 produces a DC voltage to operate the circuits in the bushing coupler 17. The power generated by power supply 27 is shown to be distributed via line(s) 271. It should be noted that the electrical power obtainable from the test tap 13 may be insufficient to operate the bushing circuitry. Therefore, an aspect of the invention includes circuitry for wirelessly providing power from an external source to the power supply 27 in addition to, or as an alternative to, the power derived from the bushing test tap.

To dielectrically isolate the power supply 27 from any other equipment, the power supply 27 may be charged or recharged by monitor 25 supplying optical signals to module 23 which includes circuitry for converting the optical signals to electric signals which can then be processed to produce DC voltages coupled via line 273 and isolation diode D6 to power supply 27 for charging or recharging the power supply 27. The optic to electric signal conversion is done to ensure that the power supply system for the bushing coupler 17 and the signal processing are dielectrically isolated from all equipment and that potential hazards are avoided without the need for batteries or an electrical connection to supply power from an external source. Depending on the level of power required it is possible to power the power supply 27 solely from the monitor 25 via the optic to electric interface of module 23. As shown in FIG. 3B, selected power signals may be supplied to light emitters LE2 in bushing monitoring system 25 which are optically (wirelessly) transmitted via optic cable 24 to light receptors LR2 (e.g., a solar cell or any suitable photovoltaic device). The light signals are wirelessly (optically) transmitted to the light receptors, such as solar or photovoltaic cells, which signals are then converted to a direct current (DC) voltage which can be supplied via line 273 to power supply 27.

FIGS. 3, 3A and 3B also show that either a measured value of line voltage or the highly accurate line voltage information obtained from the utility EMS is applied to the monitoring system 25. The monitoring system 25 includes circuitry for comparing the tap voltage obtained from the bushing coupler with the accurate line voltage to calculate the value of C1 which can then be used to determine the status and/or condition of the bushing being monitored.

Since the primary cause of bushing failure is due to the failure of the C1 or C2 capacitor, it is desirable to monitor the value of these capacitors and to do so safely. A method to determine variation in the value of C1 is achieved by reporting tap voltage developed off a low inductance precision resistor (R172 in FIG. 3A) to the bushing analysis and monitoring device 25. The tap voltage is transmitted wirelessly via the fiber optic connection from the bushing coupler to the bushing analysis device 25. The bushing monitoring device 25 is also designed to receive values of the high voltage (HV) applied to the bushing terminal 11. The value of the high voltage can be obtained, for example, by means of measurements or from a potential transformer in the substation or received from the utility's energy management system via either DNP 3.0, MODBUS, or IEC 61850. It is preferable to use the most accurate value available. Values of C1 can be calculated by using the following equation:

$$C_1 = \frac{1}{2\pi f R \sqrt{\left(\frac{V_{LINE}}{V_{TAP}}\right)^2 - 1}}$$

Where:
C1=Upper Bushing Capacitor Layer(s);
f=Line frequency (50 or 60 Hz);
R=Shunt Resistor From the Bushing Tap to Ground;
$V_{TAP}$=Voltage at the Bushing Tap; and
$V_{LINE}$=Measured or Reported Bus Voltage The calculations for determining C1 is made by appropriately programming the monitoring circuitry 25 which can also display the information in various forms. This can be done and displayed automatically and/or with the aid of an operator. Because of the wireless transmission of the signals the measurements can be conducted without concern of injury or damage due to the high line voltages.

Each bushing coupler 17 is preferably encased in a metal container which is grounded. The measuring circuitry is typically located in a transformer control cabinet or its own cabinet perhaps with other monitoring equipment.

The bushing coupler of FIG. 4 is similar to that of FIG. 3A except that the output signals (Tx) of the processor 186 are fed to a radio frequency (RF) transceiver 231 which is coupled to an antenna 212 which can transmit via RF transmission to antenna 214 which is coupled to a bushing monitor electronics 251, which functions in a similar manner to monitor 25. The RF transceiver 231 includes a radio frequency (RF) module device used to "wirelessly" transmit and/or receive radio signals between the processor 186 and the monitor 251. In FIG. 3 the wireless communication is accomplished through optical communication. In FIGS. 4 and 5 the wireless communication is through Radio Frequency (RF) communication. An advantage of RF transmission over optic transmission is that it does not require line of sight. The bushing couplers of FIGS. 4 and 5 like the ones of FIGS. 3, 3A and 3B enable the characteristics and representations of the signal at the test tap 13 to be transmitted "wirelessly" to their respective monitor 251. The wireless transmission of data to the receiver 251 ensures that the potentially dangerous high voltages at the test tap are not conductively or physically coupled to the receiver FIG. 5 is like FIG. 3B except that it illustrates that the transceiver 231 may include modulator and demodulator circuitry for modulating and demodulating the signals being transmitted. The output signals (Tx) may be fed via the modulator and RF circuitry to antenna 21 for transmission to antennae 214 and decoding within the monitor 251 to effectuate wireless, nonconductive, transmission of the signals form the bushing coupler to the bushing monitoring system.

FIGS. 4 and 5 show that, in an analogous manner to the showing in FIGS. 3, 3A and 3B, the power for the bushing coupler 17 can be obtained from RF signals emanating from the monitor electronics 251. That is, selected RF power signals from the monitor 251 can be wirelessly transmitted via antenna 214 to antenna 212 which is coupled to transceiver 231 where they are demodulated. The demodulated RF signals then produce a DC voltage which can be coupled via line 273 to power supply 27 to charge or recharge the power supply 27 in an analogous manner to that described above.

The monitor 251 (like monitor 25) is programmed to calculate C1. Line voltage information is supplied to monitor 251, where the line voltage can either be a measured value or it can be a highly accurate value supplied by a utility. The information can be continuously monitored and displayed safely without concern of being injured or damaged by a high voltage.

So, in accordance with the invention, a bushing coupler embodying the invention includes electronic circuitry for sensing the AC waveform at the bushing tap and circuitry for converting the sensed voltage to corresponding data signals. It also includes circuitry for wirelessly transmitting the data signals to a receiver physically and dielectrically isolated from the bushing coupler. The bushing coupler has its own power supply which is designed to accept either AC or DC input voltages and which provides an extremely high level of isolation in the event of a complete failure of the capacitance layer in the bushing. The bushing coupler's power supply can be charged by wirelessly transmitting energy from an outside source to the power supply

What is claimed is:

1. Apparatus for safely sensing the voltage present at the test tap of a high voltage bushing comprising:
   a bushing coupler having an input coupled to said test tap, said bushing coupler including circuitry for sensing and converting the tap voltage into corresponding data signals;
   said bushing coupler also including circuitry for processing and formatting the data signals and for wirelessly transmitting the data signals to a bushing monitoring system physically separated from the bushing coupler, whereby the bushing monitoring system receives data signals corresponding to the test tap voltage without being conductively connected to the bushing coupler or the test tap.

2. The apparatus as claimed in claim 1 wherein the circuitry in the bushing coupler for wirelessly transmitting the data signals includes a fiber optic module for effectuating the wireless transmission.

3. The apparatus as claimed in claim 2 wherein the fiber optic module includes circuitry for converting the data signals to light signals and for optically and wirelessly transmitting the light signals to fiber optic cables coupled to the bushing monitoring system.

4. The apparatus as claimed in claim 1 wherein the circuitry in the bushing coupler for wirelessly transmitting the data signals includes a radio frequency (RF) module for performing the wireless transmission.

5. The apparatus as claimed in claim 4 wherein the RF module includes circuitry for modulating the data signals and feeding them to an antenna for wirelessly transmitting them via RF transmission to the bushing monitor system.

6. The apparatus as claimed in claim 1 wherein the bushing coupler includes a power supply circuit for supplying electrical power to the bushing coupler circuitry; said power supply circuit being powered by: (a) the voltage at the test tap; or (b) signals wirelessly transmitted from the bushing monitoring system.

7. The apparatus as claimed in claim 6 wherein the circuitry for wirelessly transmitting the data signals to the bushing monitoring system also includes circuitry for receiving, wirelessly, selected signals sent from the bushing monitoring system and for processing the selected signals to produce direct current (DC) power signals for charging the power supply.

8. The apparatus as claimed in claim 7 wherein the power supply circuit includes a selectively enabled switch connected between the test tap and a voltage rectifier for converting the voltage at the test tap to a direct current (DC) voltage suitable to operate the bushing coupler circuitry.

9. The apparatus as claimed in claim 6 wherein the circuitry in the bushing coupler for wirelessly transmitting the data signals includes a fiber optic module for performing the wireless transmission and wherein the fiber optic module includes circuitry for receiving selected signals sent from the bushing monitoring system and for processing the selected signals to produce DC power signals for charging the power supply.

10. The apparatus as claimed in claim 6 wherein the circuitry in the bushing coupler for wirelessly transmitting the data signals includes an RF module for performing the wireless transmission and wherein the RF module includes circuitry for wirelessly receiving power signals selectively sent from the bushing monitoring system and for processing the power signals for charging the power supply.

11. The apparatus as claimed in claim 1 wherein the high voltage bushing includes a structure for enabling a high voltage line to pass through the bushing, and wherein the bushing is characterized in having a first capacitance, C1, present between the high voltage line and the test tap; and wherein the bushing monitoring system includes circuitry for calculating C1 in responsive to: (a) information pertaining to the high voltage line applied to the bushing and coupled via C1 to the test tap; and (b) information signals corresponding to the actual voltage at the test tap.

12. The apparatus as claimed in claim 11 wherein the information pertaining to the high line voltage applied to the bushing monitor is obtained from the electric utility company supplying the line voltage.

13. The apparatus as claimed in claim 1 wherein the bushing coupler is encased in an enclosure located in close proximity to the test tap.

14. The apparatus as claimed in claim 1 wherein a high voltage (HV) is applied to the high voltage bushing; and wherein the bushing is characterized in having a first capacitance, C1, between the high voltage and the test tap; and wherein the bushing monitoring system is adapted to receive information corresponding to the high voltage; and wherein the bushing monitoring system includes circuitry for calculating and monitoring changes in selected parameters of the high voltage bushing.

15. Apparatus for safely sensing the voltage present at the test tap of a high voltage bushing, wherein the bushing includes a first capacitance, C1, present between a high voltage terminal and the test tap and a second capacitance, C2, present between the test tap and a return terminal, the apparatus comprising:
   a bushing coupler having an input coupled to said test tap, said bushing coupler including circuitry for sensing and converting the tap voltage into corresponding data signals;
   said bushing coupler also including circuitry for processing and formatting the data signals and for wirelessly transmitting the data signals to a bushing monitoring system physically separated from the bushing coupler and not conductively connected thereto;

said bushing monitoring system also adapted to receive information corresponding to the value of the voltage applied to the high voltage terminal for determining the status of selected parameters of the high voltage bushing.

16. The apparatus as claimed in claim 15 wherein the circuitry for wirelessly transmitting the data signals includes a fiber optics module.

17. The apparatus as claimed in claim 15 wherein the circuitry for wirelessly transmitting the data signals includes a radio frequency (RF) module.

18. The apparatus as claimed in claim 15 wherein the bushing coupler includes a power supply which is powered from the test tap.

19. The apparatus as claimed in claim 15 wherein the bushing coupler includes a power supply which is wirelessly powered by signals transmitted from the bushing monitoring system to the bushing coupler.

20. The apparatus as claimed in claim 15 wherein the circuitry for sensing and converting the tap voltage into corresponding data signals includes filter circuitry and analog to digital (A/D) circuitry; and wherein said circuitry for processing and formatting the data signals includes a processor; and wherein the circuitry for wirelessly transmitting the data signals to a bushing monitoring system includes a fiber optic module or an RF module.

* * * * *